United States Patent
Choi et al.

(10) Patent No.: US 11,629,274 B2
(45) Date of Patent: Apr. 18, 2023

(54) ADHESIVE SHEET AND TRANSPARENT ELECTRODE COMPRISING THE SAME

(71) Applicant: LMS Co., Ltd., Pyeongtaek-si (KR)

(72) Inventors: Yongwon Choi, Pyeongtaek-si (KR); Hosung Na, Pyeongtaek-si (KR); Minsoo Lee, Pyeongtaek-si (KR)

(73) Assignee: LMS CO., LTD., Pyeongtaek-si (KR)

( * ) Notice: Subject to any disclaimer, the term of this patent is extended or adjusted under 35 U.S.C. 154(b) by 570 days.

(21) Appl. No.: 16/692,087

(22) Filed: Nov. 22, 2019

(65) Prior Publication Data

US 2020/0165493 A1  May 28, 2020

(30) Foreign Application Priority Data

Nov. 26, 2018 (KR) .................. 10-2018-0146954

(51) Int. Cl.
| | |
|---|---|
| *C09J 7/38* | (2018.01) |
| *H01L 31/0224* | (2006.01) |
| *G06F 3/044* | (2006.01) |
| *B32B 7/025* | (2019.01) |
| *B32B 15/02* | (2006.01) |
| *C09J 9/02* | (2006.01) |

(52) U.S. Cl.
CPC ............ *C09J 7/385* (2018.01); *G06F 3/0446* (2019.05); *H01L 31/022433* (2013.01); *H01L 31/022466* (2013.01); *B32B 7/025* (2019.01); *B32B 15/02* (2013.01); *B32B 2307/202* (2013.01); *B32B 2307/412* (2013.01); *C09J 9/02* (2013.01)

(58) Field of Classification Search
CPC .............. C09J 9/02; C09J 11/00–11/08; C08K 3/00–3/40; C08K 2003/023–2003/387
See application file for complete search history.

(56) References Cited

U.S. PATENT DOCUMENTS

| | | | |
|---|---|---|---|
| 9,399,723 | B2 * | 7/2016 | Keite-Telgenbüscher ................... H01L 24/29 |
| 2013/0040132 | A1 * | 2/2013 | Nakao ........................ C09J 7/29 428/335 |
| 2019/0359862 | A1 * | 11/2019 | Fang ......................... C09J 9/02 |
| 2020/0291273 | A1 * | 9/2020 | Kwon ...................... H01B 1/24 |

FOREIGN PATENT DOCUMENTS

WO WO-2017154726 A1 * 9/2017 ............ C09J 201/00

OTHER PUBLICATIONS

Wang et al. "Isotropical conductive adhesives with very-long silver nanowires as conductive fillers", J Mater Sci: Mater Electron 28,(2017); pp. 10-17.*

(Continued)

*Primary Examiner* — Prashant J Khatri
(74) *Attorney, Agent, or Firm* — Polsinelli PC

(57) ABSTRACT

The present invention relates to an adhesive sheet. As the adhesive sheet of one embodiment of the present invention retains the properties of conventional adhesive sheet, such as excellent adhesion and durability in high temperature and humidity environment, it can be utilized for manufacturing large-scale electrodes at low prices, and the electrodes manufactured above can be used for various applications such as solar cell, display, and touch panel.

12 Claims, 1 Drawing Sheet

(56) References Cited

OTHER PUBLICATIONS

Bryant et al. "A Transparent Conductive Adhesive Laminate Electrode for High-Efficiency Organic-Inorganic Lead Halide Perovskite Solar Cells", Advanced Materials, vol. 26, Issue 44, (2014); pp. 7499-7504.*

Borchert et al. "Effects of length dispersity and film fabrication on the sheet resistance of copper nanowire transparent conductors", Nanoscale, (2015), 7; pp. 14496-14504.*

* cited by examiner

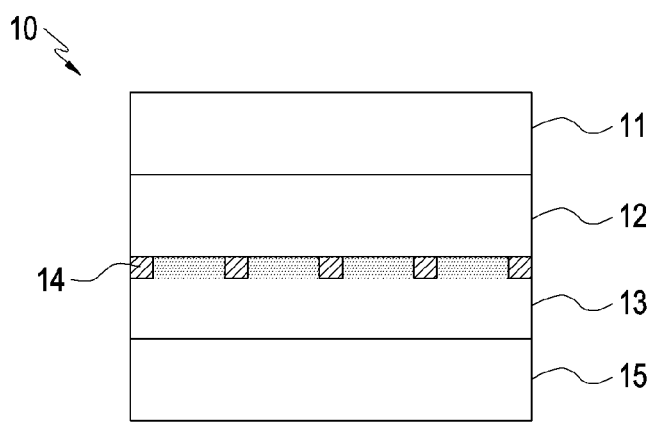

ADHESIVE SHEET AND TRANSPARENT ELECTRODE COMPRISING THE SAME

CROSS REFERENCE TO RELATED APPLICATION

This application claims priority under 35 U.S.C. 119 to Korean Patent Application No. 10-2018-0146954, filed on Nov. 26, 2018, which is hereby incorporated by reference in its entirety.

BACKGROUND

Technical Field

The present invention relates to an adhesive sheet comprising a transparent electrode.

Description of Related Art

Transparent adhesives are mainly used for interlayer adhesives for stacking functional parts for the products where manufacturing optical or electronic products such as solar cells, touch screens, or display devices.

Transparent adhesives currently commercialized have a high transparency of over 90% optical transparency, e.g. in visible light areas. In addition, the transparent adhesive is durable in high temperature and humidity conditions and can form a uniform surface, which can enhance the clarity of the screen when is used in a display device, and can provide sufficient adhesion for its application. In particular, functional transparent adhesives can be used in a variety of areas such as solar cells, flexible displays, touch screens, touch panels, or touch lenses because they are polymer materials and therefore have flexibility as well.

Without transparency or flexibility, conductive adhesives are published. For example, U.S. Patent Application No. 2009-0311502 discloses a conductive adhesive containing acrylate resin with alkyls of 4 to 14 carbon number and conductive flakes and discloses adhesives where their conductive flake is consisted of metal such as silver, gold, or copper. Higher content of conductive flakes increases the conductivity of the adhesive, but lower light transparency, and thus it is difficult to obtain uniform properties due to the difference in the density of conductive flakes and resin.

As such, conventional transparent or conductive adhesives have been limitedly used in areas where transparency is required, such as solar cells, displays, or touch screens, due to their lack of electrical conductivity or opaque properties. Also, most conductive adhesives have high manufacturing costs because they include expensive metal particles. Therefore, it is necessary to develop conductive transparent adhesive film with both transparency and electrical conductivity, as well as low manufacturing price and excellent adhesion.

SUMMARY

The object of the present invention is to provide an adhesive sheet having excellent adhesion property, transparency and conductivity and low manufacturing cost and a transparent electrode comprising the adhesive sheet.

Another object of the present invention is to provide an optical or an electronic device such as a solar cell, a display device and a touch screen device including the transparent electrode.

To achieve the object of present invention, an adhesive sheet comprises an adhesive layer including a nano-wire, and a grid electrode formed on said adhesive layer.

Still the object of the present invention is to provide the adhesive sheet, wherein a light transmittance of the adhesive sheet measured at 550 nm is greater than equal to 60%, a surface resistance of the adhesive layer is smaller than equal to 1,000Ω/□, an adhesive strength of the adhesive layer is greater than equal to 50 gf/25 mm and a thickness of the adhesive layer is 1 to 10 μm.

Further, the object of the present invention is to provide the adhesive sheet, wherein a weight percent of said nano-wire is 15 to 50 with respect to 100 weight percent of an adhesive material. The adhesive material includes one or more selected from a group of acrylic adhesives, silicone adhesives, urethane adhesives, and urethane acrylate adhesives. The nano-wire comprises a conductive metal or a conductive metal oxide.

The object of the present invention is to provide the adhesive sheet, wherein the grid electrode includes one or more selected from a group of copper (Cu), aluminum (Al), silver (Ag), and nickel (Ni) and the adhesive layer is formed on a polymer.

The object of the present invention is to provide a transparent electrode comprising the adhesive sheet and to provide a solar cell, a display device, and a touch screen panel comprising the transparent electrode.

BRIEF DESCRIPTION OF DRAWINGS

FIG. 1 is a cross-sectional view of a solar cell including an adhesive sheet according to one embodiment of the present invention.

DETAILED DESCRIPTION

The present disclosure will be described in detail with reference to the accompanying drawings. The same elements in the drawings have the same reference numerals and thus the cumulative explanation will be omitted for simplicity. And the described terms are defined by considering the function in the present disclosure, which may be varied according to the user's intention or convention. Therefore, the definition of the terms used should be interpreted on the basis of the content throughout this description and corresponding functions.

The present invention is to provide an adhesive sheet further including a transparent electrode.

The adhesive sheet of the present invention comprises an adhesive layer and an electrode formed on the adhesive layer with a grid-type.

The adhesive layer of the present invention also includes a nano-wire. "The nano-wire" of the present invention is a nano structure having an average diameter in nanometers ($10^{-9}$ m) such as average diameter in numbers or hundreds of nm. The nano-wire can also mean nanostructures with a ratio of length (L) to width (d) of more than 100 or more, or 1,000 or more. On the other hand, the nano-wire may mean nanostructures with the limited thickness or diameter of tens of nm or less, but with unrestricted length of hundreds of nm or more.

Although inventors in the present invention conducted various tests to develop adhesion layers that satisfy all of the light transmittance, conductivity, and adhesion, surprisingly, only nanowire-type additives with a length-to-width ratio of 100 or more of the various additives to give conductivity can satisfy all of the above three properties.

In the preferred embodiment, the light transmittance of the adhesive sheet (measured at 550 nm) with grid-type electrodes and adhesive layers is more than 60%, 70%, 75%, 78%, 79%, or 80%. The upper limit on light transmittance is not specifically limited, but typically below 95%, 92%, 90%, or 85%. If the light transmittance is less than 60%, the usage may be limited because of the lack of transparency. In addition, it is preferred that the light transmittance measured at 550 nm, without including the grid electrodes, is not less than 60%, 70%, 75%, 78%, 79%, or 80%. The upper limit of the light transmittance of the adhesive layer may be the same as that of the above-mentioned adhesive sheet. The light transmittance can be controlled by the type of adhesives used, the thickness of the adhesives, and the amount or volume ratio of nanowires included in the adhesive layer. The light transmittance can be measured by means of a known method, for example ASTM D1003, or D1004.

The surface resistance of the adhesive layer of one embodiment of the present invention is, for example, not more than 1,000 Ω/□, 900 Ω/□, 800 Ω/□, 700 Ω/□, 670 Ω/□, 640 Ω/□, 620 Ω/□, 610Ω/□, or 600Ω/□. Upper limits for surface resistance are not specifically limited, but typically more than 10 Ω/□, 50 Ω/□, 100 Ω/□, 200 Ω/□, 300 Ω/□, 400Ω/□, or 500Ω/□. If the surface resistance is within the above range, the adhesive layer may be conductive. Thus, even in areas where grid electrodes are not formed and where only the adhesive layer exists, the movement of electrons or holes can be accelerated.

The surface resistance of the adhesive sheet of one embodiment of the present invention including the adhesive layer and the grid electrode, for example, is not more than 100 Ω/□, 90 Ω/□, 80 Ω, 70 Ω/□, 60Ω/□, or 50Ω/□. The lower limit of surface resistance is not specifically limited, but typically, for example, is not less than 1 Ω/□, 2 Ω/□, 5 Ω/□, 10Ω, or 20Ω/□. The surface resistance can be controlled by the type of adhesives used, the amount and/or the volume ratio of nanowires in the adhesive layer. The surface resistance can be measured by means of a known method, for example ASTM F1844.

The adhesion of the adhesive layer is not less than 50 gf/25 mm, not less than 100 gf/25 mm, not less than 200 gf/25 mm, not less than 340 gf/25 mm, not less than 360 gf/25 mm, not less than 380 gf/25 mm, not less than 390 gf/cm, or not less than 390 g/25 mm. The upper limit of adhesion is not specifically limited, but for example, not more than 1,000 gf/25 mm, not more than 900 gf/25 mm, not more than 850 gf/25 mm, not more than 800 gf/25 mm, not more than 700 gf/25 mm, not more than 650 gf/25 mm, or not more than 600 gf/25 mm. If the adhesion is within the above range, the conductivity and light transmittance can be satisfied at the same time while maintaining the adhesion requiring for various applications. The adhesion can be controlled by the type of adhesives used, the amount and/or the volume ratio of nanowires in the adhesive layer. The measurement of the adhesion is known to an ordinary skill in the art, and typically measured by Universal Testing Machine (UTM) at a specific speed and angle.

In addition, a range of the thickness of the adhesive layer is, for example, 1 to 10 μm, 2 to 8 μm, or 3 to 7 μm. In terms of satisfying the light transmittance, conductivity, and adhesion at the same time, it is preferred that the thickness of the adhesive layer fall within the range stated above.

The adhesive layer may include 15 to 50, 16 to 30, or 17 to 28 weight percent of the nanowire with respect to 100 weight percent of the adhesive material. If the amount of nanowire in the adhesive layer is too low, it is likely that the conductivity is reduced, and if the amount of nanowire in the adhesive layer is too high, it is likely that the light transmittance and the adhesion may be deteriorated.

The adhesive materials used in the adhesive layer are not specifically limited if they are transparent adhesives, but may include one or more types of adhesive materials selected from a group of acrylic adhesives, silicon adhesives, urethane adhesives, and urethane acrylate adhesives. The adhesive layer may also use heat conductive adhesives, removable adhesives, high or low viscosity adhesives, decompressive adhesives, heat or photo or moisture hardening adhesives, self-wetting adhesives, structured adhesives, soft deformed adhesives, challenging adhesives, high or low dielectric adhesives, or hot-melt adhesives. Depending on the required properties of the application for which the adhesive layer is used, an ordinary skill in the art may choose specific types of adhesives such as acrylic adhesives and silicon adhesives.

In addition, the types of nanowires used in the adhesive layer are not specifically limited, as long as they can provide conductivity to the adhesive layers, but nanowires, for example, are made of one or more conductive metal oxide including conductive metals such as (Ag), aluminum (Al), tungsten (W), nickel (Ni), copper (Cu), gold (Au), or platinum (Pt); oxide like zinc oxide; or oxide complex like zinc oxide doped with metal such as aluminum (Al), gallium (Ga), tin (Sn), indium (In).

The adhesive sheet of one embodiment of the present invention includes grid electrodes formed on the adhesive layer stated above.

The term used in this specification, "grid electrode", means an electrode that contains a conductive area formed from a conductive material and a nonconductive area formed by an empty space where a conductive material does not exist. For example, if a grid electrode is viewed from the top, it can mean the grid electrode whose area of conductivity is not more than 30%, not more than 20%, not more than 10%, or not more than 8% of the total area.

These grid electrodes may contain, but are not limited to, more than one type selected from a group of copper (Cu), aluminum (Al), silver (Ag), and nickel (Ni). The grid electrodes may contain alloys of more than one type of metal above, or metals of different materials may form a multilayer structure of more than one layer.

In another preferred embodiment, the adhesive layer may be formed on the polymer substrate. In this case, the adhesive sheet may contain the adhesive layer formed on the polymer substrate and then grid electrodes formed sequentially on the adhesive layer. If the polymer substrate is used for the adhesive sheet, it can provide not only transparency but also flexibility thereby it can be used for a variety of applications, such as a flexible display.

The present invention is also related to the transparent electrodes including the adhesive sheet.

According to one embodiment of the present invention, the adhesive sheet itself may form transparent electrodes, or additional transparent electrodes. Also, the grid electrodes may be stacked, either on the grid electrodes or on the adhesive layer or on the adhesive sheet, depending on their application.

The present invention is also relates to solar cells, display units, or touch screens comprising the transparent electrodes stated above. Each configuration and arrangement of solar cells, display units, and touch screens is well disclosed, so the detailed description of them shall be omitted.

In the preferred embodiment, FIG. 1 discloses the structure of a solar cell (10) according to one embodiment of the present invention. The solar cell (10) of the present invention may comprise adhesive layer (13) formed on a substrate (15), a solar cell activation layer (12) formed on the adhesive layer (13) and a front side electrode (11) formed on the solar cell active layer (12).

The substrate (15) may use a transparent polymer material, if necessary, the substrate (15) it may be removed from the adhesive layer (13) and attached the solar cell through the adhesive layer to other surfaces, e.g. glass window of the building. In this case, the transparent glass of the building can act as a solar cell at the same time.

A grid electrode (14) can be formed on the adhesive layer (13) as described above. The thickness of the grid electrode (14) may be thinner than the thickness of the adhesive layer, e.g. 0.1 to 5 μm thick. Considering the moving aspect of electrons or holes, it is desirable that the grid electrode (14) is constructed to make a direct contact with the solar cell active layer (12). In this case, the area where the grid electrode (14) does not contact with the solar cell active layer (12) can provide better efficiency because it provides an extra electrons or holes moving passage to the conductive adhesive layer (13) according to one embodiment of the present invention.

The solar cell active layer (12) is not specifically restricted, but it can use an active layer with transparency such as perovskite, and a publicly known transparent electrode or an electrode according to one embodiment of the present invention can be used of the front electrode (11) on a light receiving side.

The following, the detail description of embodiments of the present invention is disclosed by more preferred embodiments and experimentation for the present invention.

However, the following embodiments and experiments are only examples of practicing the present invention, and the present invention is not limited to the examples of embodiments and experimentation.

Embodiments 1 to 5

As shown in Table 1 below, an adhesive sheet of 5μm thick is formed by mixing conductive materials (silver spheres, silver flakes, and silver nanowires), adhesive material (POA-N4601: acryl adhesive, purchased from Aekyung Chemical Co., Ltd.), solvent (75:25 mixtures of ethyl acetate and toluene), and initiators (AK-SEX: epoxy initiation, purchased from Aekyung Chemical Co., Ltd.) in a Voltex mixer for 3 minutes to make a compound for the formation of an adhesive layer, then by deposing the adhesive layer on a polymer substrate (75 μm PET, purchased from SKC Co., Ltd.), and at last by drying at 150° C. for 5 minutes.

Comparisons 1 to 9

Except for adjusting the resin composition as shown in Table 1, the adhesive sheet was manufactured by performing the same manner as described in Embodiment 1.

Experimentation

To evaluate the performance of the adhesive sheet according to one embodiment of the present invention, the following experimentations have been carried out.

(A) Evaluation of Light Transmittance

A protective film of one side of the adhesive sheet (a structure of protective film/adhesive layer/protective film) was removed to expose the adhesive surface, and a glass substrate (average thickness: 0.55T) was attached to the adhesive sheet with the adhesive surface exposed. Then, the remaining protective film of the adhesive sheet was removed and a specimen with a structure of glass substrate/adhesive layer was prepared. In accordance with ASTM D1003, the overall light transmittance of the specimen prepared in a haze meter (model name: NDH200N) was measured and the average light transmittance to 550 nm was derived from the measured results.

(B) Surface Resistance Evaluation

After cutting the adhesive sheet to a size of 25 mm in width×100 mm in length, the protective film on one side of the cut adhesive sheet was removed to expose the adhesive surface. The surface resistance was measured by contacting a touch pin directly to the adhesive sheet utilizing a four-terminal resistance meter, or by using a contactless resistance meter.

(C) Adhesion Evaluation

After cutting the adhesive sheet to a size of 25 mm in width×100 mm in length, the protective film on one side of the cut adhesive sheet was removed to expose the adhesive surface, and then the PET film with a thickness of 25 μm was attached to the adhesive surface. The remaining protective film of the specimen was then removed to expose the adhesive surface, placed on a transparent substrate with the surface exposed, and pressed and attached by a 2 kg roller (width: approximately 50 mm) with a round trip. Here, a glass substrate, a polycarbonate (PC) substrate or a polymethyl-methacrylate (PMMA) substrate and polyethylene terephthalate (PET) substrate were used for the transparent substrate. The specimen was then left for 30 minutes, utilizing a tensile tester, the specimen was peeled from the transparent substrate with a peeling angle of 180° and a tensile speed of 300 mm/min under the conditions of 23° C., 50% RH, and the peel adhesion strength (gf/25 mm) was measured.

TABLE 1

| Embodiments/Comparison | Composition Amount | | | | | Property Analysis Result | | | |
|---|---|---|---|---|---|---|---|---|---|
| | Conductive Component | Conductive Component Amt. [w.t.] | AdhesiveAmt. [w.t.] | SolventAmt. [w.t.] | InitiatorAmt. [w.t.] | Layer Thickness [um] | Light Transmittance @550 nm [%] | Surface Resistance [Ω/□] | Adhesion [g] |
| Embodiment 1 | Ag sphere | 0.0 | 97.5 | — | 2.50 | 5 | 90.0 | — | 1,000 |
| Embodiment 2 | Ag sphere | 40.0 | 7.5 | 52.3 | 0.19 | 5 | 19.9 | — | 25 |
| Embodiment 3 | Ag flake | 20.0 | 7.5 | 72.3 | 0.19 | 5 | 47.2 | 5 | 12 |
| Embodiment 4 | Ag flake | 40.0 | 7.5 | 52.3 | 0.19 | 5 | 16.4 | — | 6 |
| Embodiment 5 | Ag NW | 1.0 | 7.5 | 91.3 | 0.19 | 5 | 88.0 | — | 842 |
| Comparison 1 | Ag NW | 1.5 | 7.5 | 90.8 | 0.19 | 5 | 84.0 | 594 | 566 |
| Comparison 2 | Ag NW | 2.0 | 7.5 | 90.3 | 0.19 | 5 | 81.0 | 554 | 424 |
| Comparison 3 | Ag NW | 2.5 | 7.5 | 89.8 | 0.19 | 5 | 76.5 | 426 | 231 |
| Comparison 4 | Ag NW | 3.0 | 7.5 | 89.3 | 0.19 | 5 | 72.2 | 324 | 154 |
| Comparison 5 | Ag NW | 3.5 | 7.5 | 88.8 | 0.19 | 5 | 68.0 | 288 | 136 |

TABLE 1-continued

| Embodiments/Comparison | Composition Amount ||||| Property Analysis Result ||||
|---|---|---|---|---|---|---|---|---|---|
| | Conductive Component | Conductive Component Amt. [w.t.] | AdhesiveAmt. [w.t.] | SolventAmt. [w.t.] | InitiatorAmt. [w.t.] | Layer Thickness [µm] | Light Transmittance @550 nm [%] | Surface Resistance [Ω/□] | Adhesion [g] |
| Comparison 6 | Ag NW | 5.0 | 7.5 | 87.3 | 0.19 | 5 | 55.6 | 198 | 95 |
| Comparison 7 | Ag NW | 10.0 | 7.5 | 82.3 | 0.19 | 5 | 41.5 | 168 | 72 |
| Comparison 8 | Ag NW | 20.0 | 7.5 | 72.3 | 0.19 | 5 | 30.0 | 132 | 56 |
| Comparison 9 | Ag NW | 30.0 | 7.5 | 62.3 | 0.19 | 5 | 22.2 | 85 | 32 |

According to embodiments of the present invention, an adhesive sheet can provide excellent adhesive property and durability at the high temperature and humidity condition while maintaining its natural property, transparency and conductivity. As a result, the adhesive sheet in the present invention can be utilized for manufacturing electrodes for a large size panel, especially for a solar cell, a display device, and a touch screen panel, etc.

While the present disclosure has been described above with reference to the aspect, it would be appreciated by those skilled in the art that it is possible to variously modify and change the present disclosure, without departing from the spirit and regions of the present disclosure described in the claims below.

What is claimed is:

1. An adhesive sheet comprising;
an adhesive layer including a nano-wire; and
a grid electrode formed on said adhesive layer,
wherein the nano-wire has a ratio of length (L) to width (d) of more than 100,
wherein a weight percent of the nano-wire is 15 to 50 with respect to 100 weight percent of an adhesive material,
wherein the grid electrode includes a conductive area formed of a conductive material and a non-conductive area formed of an empty space, the conductive area being less than 30% of a total area of the grid electrode,
wherein the grid electrode has a thickness less than the adhesive layer, and
wherein a light transmittance of said adhesive sheet measured at 550 nm is greater than equal to 60%, and smaller than equal to 95%.

2. The adhesive sheet of claim 1, wherein a surface resistance of said adhesive layer is smaller than equal to 1,000 Ω/□.

3. The adhesive sheet of claim 1, wherein an adhesive strength of said adhesive layer is greater than equal to 50 gf/25 mm.

4. The adhesive sheet of claim 1, wherein a thickness of said adhesive layer is 1 to 10 µm.

5. The adhesive sheet of claim 1, wherein said adhesive material includes one or more selected from a group of acrylic adhesives, silicone adhesives, urethane adhesives, and urethane acrylate adhesives.

6. The adhesive sheet of claim 1, wherein said nano-wire includes a conductive metal or a conductive metal oxide.

7. The adhesive sheet of claim 1, wherein said grid electrode includes one or more selected from a group of copper (Cu), aluminum (Al), silver (Ag), and nickel (Ni).

8. The adhesive sheet of claim 1, wherein said adhesive layer is formed on a polymer.

9. A transparent electrode comprising the adhesive sheet of claim 1.

10. A solar cell comprising the transparent electrode of claim 9.

11. A display device comprising the transparent electrode of claim 9.

12. A touch screen panel comprising the transparent electrode of claim 9.

* * * * *